United States Patent
Tan et al.

(10) Patent No.: US 8,598,948 B1
(45) Date of Patent: *Dec. 3, 2013

(54) SELF BIASED LOW NOISE HIGH PSRR CONSTANT GM FOR VCO

(71) Applicant: Marvell International Ltd., Hamilton (BM)

(72) Inventors: Chun-Geik Tan, Singapore (SG); Randy Tsang, Foster City, CA (US); Yonghua Song, Cupertino, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/685,336

(22) Filed: Nov. 26, 2012

Related U.S. Application Data (63) Continuation of application No. 12/694,922, filed on Jan. 27, 2010, now Pat. No. 8,319,547, which is a continuation of application No. 11/586,393, filed on Oct. 24, 2006, now Pat. No. 7,667,533.

(60) Provisional application No. 60/737,264, filed on Nov. 16, 2005.

(51) Int. Cl.
*G05F 1/10* (2006.01)

(52) U.S. Cl.
USPC ............................ 327/541; 327/538; 327/543

(58) Field of Classification Search
USPC .................. 327/538, 540–543; 323/313, 315; 331/185, 186
See application file for complete search history.

(56) References Cited

U.S. PATENT DOCUMENTS

| | | | | |
|---|---|---|---|---|
| 5,399,960 | A * | 3/1995 | Gross | 323/313 |
| 6,381,491 | B1 * | 4/2002 | Maile et al. | 607/2 |
| 6,831,503 | B2 * | 12/2004 | La Rosa | 327/541 |
| 7,227,401 | B2 * | 6/2007 | Zhang et al. | 327/513 |
| 7,667,533 | B1 * | 2/2010 | Tan et al. | 327/541 |
| 8,319,547 | B1 * | 11/2012 | Tan et al. | 327/541 |
| 2004/0239413 | A1 * | 12/2004 | Gubbins | 327/539 |

\* cited by examiner

*Primary Examiner* — Long Nguyen (57) ABSTRACT

A system and method for voltage controlled oscillator (VCO) biasing in low voltage circuits including low resistance elements that are especially susceptible to noise. In one embodiment, a poly resistor and triode resistor is used to cancel or offset the effects that temperature variations have on the circuit. The triode resistor is powered by a voltage source that uses a pair of diodes coupled to a constant transconductance (gm) circuit to generate a reduced noise voltage that is independent of the power supply noise. The size of the triode resistor and poly resistors can be varied.

19 Claims, 9 Drawing Sheets

SELF BIASED LOW NOISE HIGH PSRR CONSTANT GM FOR VCO

CROSS-REFERENCES TO RELATED APPLICATIONS

This application is a continuation application of U.S. Non-Provisional application Ser. No. 12/694,922, filed Jan. 27, 2010 (now U.S. Pat. No. 8,319,547), which is a continuation application of U.S. Non-Provisional Application Ser. No. 11/586,393, filed Oct. 24, 2006 (now U.S. Pat. No. 7,667,533), which claims the benefit of U.S. Provisional Application No. 60/737,264 filed Nov. 16, 2005. The contents of U.S. Non-Provisional application Ser. No. 12/694,922 (now U.S. Pat. No. 8,319,547), U.S. Non-Provisional application Ser. No. 11/586,393 (now U.S. Pat. No. 7,667,533), and U.S. Provisional Application No. 60/737,264 are each incorporated by reference in their entirety.

BACKGROUND OF THE INVENTION

The invention relates to semiconductor circuits and more particularly to circuits and methods used to bias voltage controlled oscillators.

Voltage controlled oscillators are electronic circuits that are used to control an output oscillation frequency as a function of input voltage. Voltage controlled oscillators are used in many applications including function generators and phase lock loops. For example, function generators use voltage controlled oscillators to repetitively and reliably sweep the frequency of an output waveform between an upper and a lower limit. Phase lock loops use voltage controlled oscillators to match the frequency and phase of an input signal with a reference signal by raising or lowering the frequency of the voltage controlled oscillator until it is matched to the reference signal. In the prior art, voltage controlled oscillators are typically biased by a constant current that is generated with a voltage source and transistor or by a constant transconductance (gm) biasing circuit as illustrated in FIG. 1.

Figure 1:
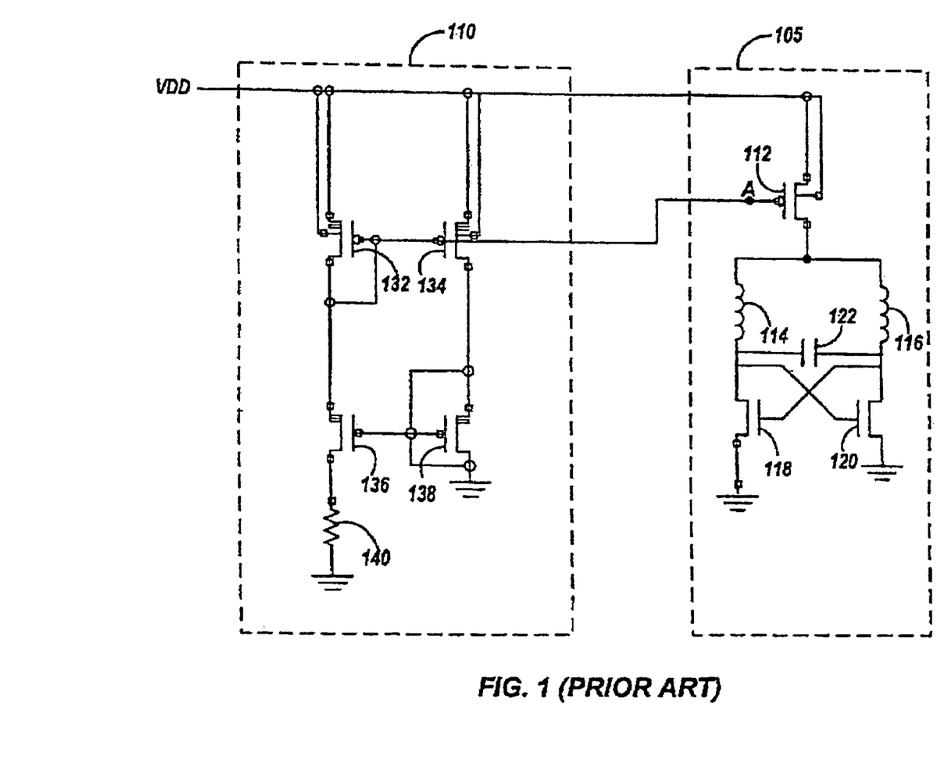
FIG. 1 is an illustration showing a prior art voltage controlled oscillator (VCO) that is biased with a constant gm biasing circuit.

FIG. 1 is an illustration showing a prior art voltage controlled oscillator (VCO) 105 that is biased with a constant transconductance (gm) biasing circuit 110. VCO 105 includes a first transistor 112, a first inductor 114, a second inductor 116, a second transistor 118, a third transistor 120, and a capacitor 122. The first transistor 112 is a PMOS transistor with its source and body coupled to the voltage bus held at voltage VDD, its drain coupled to both the first inductor 114 and the second inductor 116, and its gate coupled to the constant gm biasing circuit 110. First inductor 114 has a first end coupled to the drain of first transistor 112 and a second end coupled to both the drain of second transistor 118 and the gate of third transistor 120. Similarly, second inductor 116 has a first end coupled to the drain of first transistor 112 and a second end coupled to both the drain of third transistor 120 as well as the gate of second transistor 118. Both second transistor 118 and third transistor 120 have their sources coupled to ground. Capacitor 122 is connected between one end of the first inductor 112 and one end of the second inductor 114.

The constant gm biasing circuit 110 includes a fourth transistor 132, a fifth transistor 134, a sixth transistor 136, a seventh transistor 138 and resistor 140. Fourth transistor 132 is a PMOS transistor with its source and body also coupled to the voltage bus held at voltage VDD, its drain coupled to transistor 136, and its gate coupled to the transistor 134. Fifth transistor 134 is a PMOS transistor with its source and body coupled to the voltage bus held at voltage VDD, its drain coupled to transistor 138, and its gate coupled to the transistor 132. The gates of both transistor 132 and transistor 134 are coupled to the gate of first transistor 112 of the VCO 105 at point A. Sixth transistor 136 is an NMOS transistor with its source coupled to a resistor 140, its drain coupled to transistor 132, and its gate coupled to both transistor 138 and the bypass loop used for generating a mirror current. Seventh transistor 138 is an NMOS transistor with its source and body coupled to ground, its drain coupled to both transistor 134 and the bypass loop used to generate the mirror current. The resistor 140 is grounded.

As described above, the prior art constant gm biasing circuit 110 utilizes thin gate NMOS and PMOS devices. The biasing current generated by the constant gm biasing circuit 110 is dictated by the square law shown in equation (1) below.

$$I = \frac{1}{2\mu_n Cox(W/L)R_{eq}^2} \tag{1}$$

The equivalent resistance $R_{eq}$ is the resistance seen by $\Delta V_{gs}$ of the constant gm circuit where $V_{gs}$ is the voltage between the gate and source of the transistors characterized as thin gate NMOS and PMOS devices.

Although conventional bandgap biasing has worked in the past for biasing VCO circuit 105, it is unable to meet the stringent requirements for low noise and low power consumption demanded by modern VCO core biasing applications. Conventional bandgap biasing is inadequate because bandgap reference circuits require larger voltage headroom. For example, a PNP transistor requires a base emitter voltage $V_{BE}$ of approximately 0.8 volts which is more than one-half of the typical 1.5 volt power supply requirement. When the bandgap biasing circuit is used with a regulated power supply that outputs approximately 1.5 volts, the current mirror suffers from tight voltage headroom and low voltage saturation $V_{DSAT}$ causing higher noise. This higher noise does not meet modern stringent requirements. Moreover, the high base resistance of PNP transistors contributes to the high noise in the bandgap reference voltage. Another source of noise can be from the power supply where noise frequency can be amplified by a device such as a VCO that has a low power supply rejection ratio (PSRR). Since the PSRR measures how well a device rejects the noise in the power supply line, a low PSRR is an indication that the VCO will be noisy.

Another problem with biasing the VCO with the constant gm biasing circuit 110, as illustrated in FIG. 1, is that it overcompensates required VCO swing due to variations in temperature. On the other hand, if the VCO is biased using a constant current rather than the constant gm biasing circuit 110, then an increase in temperature may result in lower VCO swing affect the bias on the VCO. In addition, resistor 140 is subject to process variations from chip to chip, which will vary the gm bias.

Therefore, it would be desirable to provide a system and method to bias a voltage controlled oscillator that is not affected by variations in temperature and can operate under low power consumption requirements as well as low noise requirements and have a high power supply rejection ratio (PSRR).

BRIEF SUMMARY OF THE INVENTION

Embodiments of the present invention provide techniques, methods, codes and apparatuses for biasing a voltage controlled oscillator (VCO) so that it is not significantly affected by variations in temperature and can operate having high power supply rejection ratio (PSRR) as well as low noise requirements. The apparatus includes a bias circuit which includes a triode resistor. The triode resistor may be implemented by configuring a transistor to operate in the triode region. The triode resistor is affected by temperature in the same manner as the transistors of the VCO, thus canceling any temperature effect. A self biasing circuit is added to provide a stable voltage to the triode resistor. The technique, method and code includes processes for generating a self bias voltage used to bias a VCO so that it is not affected by variations in temperature and can operate having a high PSRR.

In another embodiment of the present invention, the self biasing circuit further includes a transistor to adjust an incoming voltage to be within a suitable range for the triode resistor. The transistor adjusts an incoming voltage, and outputs a voltage, ranging, for example, from approximately 1.1 volts to 1.3 volts. The voltage output is approximately 1.2 volts in one embodiment.

In yet another embodiment of the present invention, the self biasing circuit is coupled to the constant gm circuit so that it mirrors the current of the constant gm circuit.

In yet another embodiment of the present invention, the triode resistor is connected in series with a programmable resistor. The programmable resistor can be disposed between the constant gm circuit and the triode resistor to selectively affect the current in the constant gm circuit. The programmable resistor is a series of polysilicon resistors in parallel which can be selected by a switching circuit. The switching circuit includes transistors connected between each of the resistors and the triode resistor.

In yet another embodiment of the present invention, the self biasing circuit includes a high impedance transistor coupled to a node, wherein the node is coupled to a pair of series connected diode-connected transistors. The node can be used to drive the triode resistor.

In another embodiment of the present invention, a method for biasing a voltage controlled oscillator includes biasing the voltage controlled oscillator using a constant gm circuit, using a triode resistor to affect a current in the constant gm circuit to track temperature changes in the voltage controlled oscillator, and providing a stable voltage to the triode resistor. In one embodiment a self biasing circuit is used to provide the stable voltage to the triode resistor.

In yet another embodiment of the present invention, a stable voltage is provided by adjusting an incoming voltage to the triode resistor to be within a suitable voltage range for the triode resistor. The incoming voltage can be adjusted so that the output is a voltage ranging, for example, from approximately 1.1 volts to 1.3 volts. The voltage output is approximately 1.2 volts, in one embodiment.

In yet another embodiment of the present invention, the constant gm circuit and triode resistor are self biased during start up of the voltage controlled oscillator using a self biasing circuit.

In yet another embodiment of the present invention, the method for biasing a voltage controlled oscillator includes providing a mirror current in the self biasing circuit by coupling the constant gm circuit to the self biasing circuit.

In yet another embodiment of the present invention, the method for biasing a voltage controlled oscillator includes providing a programmable resistor to adjust the impedance of the constant gm circuit. The programmable resistor can be used to selectively activate switches which engage a series of polys iii con resistors in parallel. In one embodiment, the switches can be selectively activated by supplying voltages to the gates of transistors which are configured to act as switches.

In another embodiment of the present invention, a circuit for biasing a voltage controlled oscillator includes a means for biasing the voltage controlled oscillator using a constant gm circuit, a means for affecting a current in the constant gm circuit to track temperature changes in the voltage controlled oscillator, and a means for providing a stable internal voltage to the means for affecting a current in the constant gm circuit.

In yet another embodiment of the present invention, the means for affecting a current in the constant gm circuit further includes a means for operating a transistor configured as a triode resistor in the triode region.

In yet another embodiment of the present invention, a stable voltage is provided by a means for adjusting an incoming voltage so that the output is within a suitable range for the triode resistor. The means for adjusting the incoming voltage adjusts the incoming voltage so that the output is a voltage ranging, for example, from approximately 1.1 volts to 1.3 volts. The means for adjusting the incoming voltage produces a voltage output of approximately 1.2 volts, in one embodiment.

In yet another embodiment of the present invention, the means for biasing a voltage controlled oscillator includes providing a means for generating a mirror current in the self biasing circuit.

In yet another embodiment of the present invention, the means for biasing a voltage controlled oscillator includes a means for starting up the biasing of the voltage controlled oscillator.

In yet another embodiment of the present invention, the means for biasing a voltage controlled oscillator includes a means for programming the resistance of the constant gm circuit.

In another embodiment of the present invention, a code is used to apply voltages to the transistors used as switches. The code can be used to control the voltage applied to only one transistor or it can be used to control the voltage applied to several transistors or to all of the transistors.

In yet another embodiment of the present invention, the code for biasing a voltage controlled oscillator includes code for biasing the voltage controlled oscillator using a constant gm circuit, code for affecting a current in the constant gm circuit to track temperature changes in the voltage controlled oscillator, and code for providing a stable voltage to the triode resistor.

In yet another embodiment of the present invention, the code adjusts an incoming voltage to the triode resistor to be within a suitable voltage range for the triode resistor. The incoming voltage can be adjusted by the code so that the output is a voltage ranging, for example, from approximately 1.1 volts to 1.3 volts.

In one embodiment, the code adjusts the voltage output to be approximately 1.2 volts.

In yet another embodiment of the present invention, the code is used to adjust the resistance of the constant gm circuit.

In yet another embodiment of the invention the code is used to activate one or more of the transistors in the constant gm circuit to flow current through the desired number of polysilicon resistors.

DETAILED DESCRIPTION OF THE INVENTION

Embodiments of the present invention provide techniques, methods, codes and apparatuses for biasing a voltage controlled oscillator (VCO) that is not substantially affected by variations in temperature and can operate having high power supply rejection ratio (PSRR) requirements as well as low noise requirements. The apparatus can include a circuit which provides a triode resistor that is chosen to track and compensate for the swing in the constant transconductance (gm) circuit caused by temperature changes. The apparatus can also include a self biasing circuit that is chosen to provide a stable voltage to the constant gm biasing circuit. The self biasing circuit generates a voltage output that has filtered out noise in the power supply voltage. Additionally, the apparatus can include a circuit to adjust for random lot-to-lot variations in resistor values.

Figure 2:
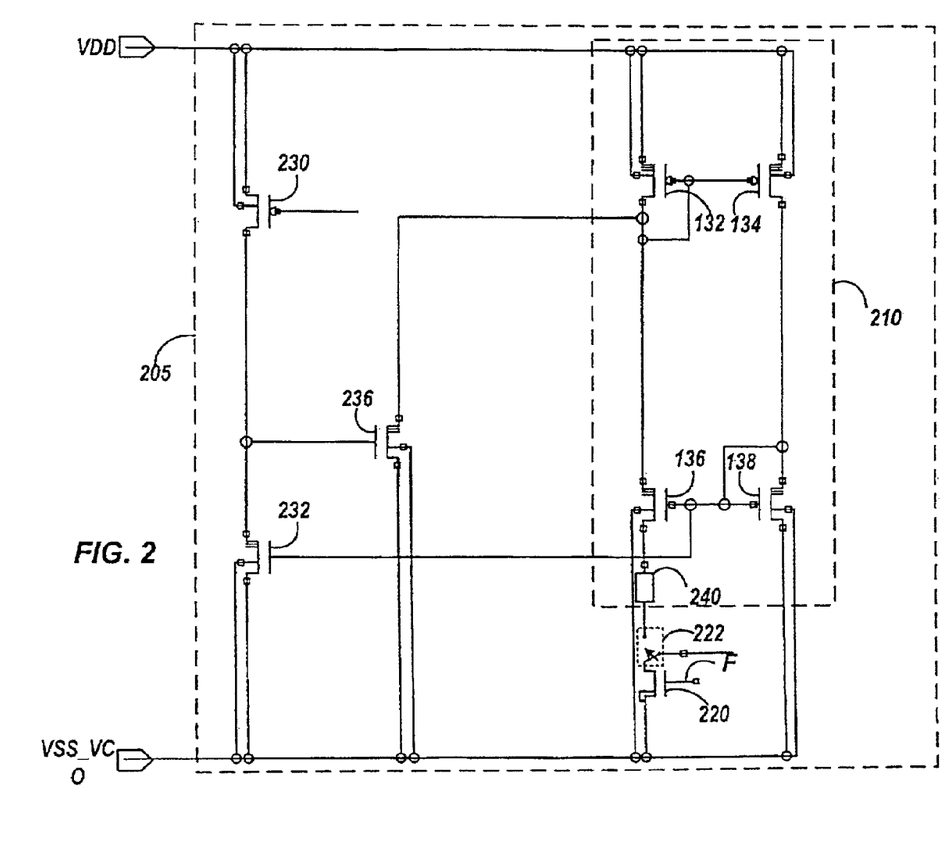
FIG. 2 is a circuit diagram illustrating a constant gm biasing circuit including a triode resistor, in accordance with one embodiment of the invention.

FIG. 2 is a circuit diagram illustrating an embodiment of a constant gm biasing core 205 for a VCO including a constant gm circuit 210, a triode resistor 220, a switch 222, a first transistor 230, a second transistor 232, and a third transistor 236. The constant gm circuit 210 is similar to the constant gm circuit 110 of the prior art except that resistor 140 has been replaced with programmable polysilicon resistor 240 and a triode resistor 220. In one alternate embodiment, only triode resistor 220 is used. The triode resistor 220 is an NMOS device operating in the triode region. Triode resistor 220 is chosen to cancel or offset variations in current in the VCO caused by temperature changes. Switch 222 is used to program polysilicon resistor 240, which is shown in more detail in FIG. 3. The constant gm circuit 210 is positioned in VCO core 205 and is used to bias the VCO. Transistors 230, 232, and 236 are used to startup VCO core 205.

In one embodiment, programmable resistor 240 is a plurality of polysilicon resistors arranged in parallel, as is further discussed with reference to FIG. 3 below. In this embodiment, a plurality of switches is also used to individually engage the polysilicon resistors.

Triode resistor 220, which is an NMOS device operating in the triode region, is used to counter the temperature effects on the transistors of the VCO so that a bias voltage can be delivered to the VCO which compensates for such temperature effects. In another embodiment of the present invention, the triode resistor 220 is a PMOS device operating in the triode region. The triode region occurs when the voltage between the gate and source (Vgs) is greater than the threshold voltage (Vth) and the drain voltage is lower than the gate voltage by at least Vth volts. In the triode region, the current characteristics of the constant gm circuit 210 and the triode resistor 220 can be approximately described by the relationship in equation (2) below.

The value of the triode resistor is optimized for best performance. Since is proportional to $1/[T^{1.5-2.0}]$, the biasing current from the constant gm circuit 210 increases as temperature increases. Also, since the VCO core operates with large signal conditions, its gain depends on the large signal gm of the negative resistance cross coupled pair. Simulation results reveal that constant gm circuit 110 overcompensates when the temperature changes from a low temperature to a higher temperature. In order to mitigate the effects of temperature on the VCO bias, the triode resistor 220 is introduced into the constant gm biasing circuit 210. With the triode resistor 220 in place, $R_{eq}$ includes both the polysilicon resistor 240 and the triode resistor 220 so that $R_{eq}$ includes both the polysilicon into the introducing triode resistor in constant gm biasing, equation (I) can be rewritten as:

$$I = \frac{1}{2\mu_n Cox(W/L)\left[R_{poly} + \frac{1}{2\mu_n Cox(W/L)_2(Vgs - Vth)}\right]^2} \quad (2)$$

where $\mu_n$ is a physical constant known as the electron mobility and its value is related to the electrons in the induced n channel, $C_{ox}$ is called the oxide capacitance and is the capacitance per unit area of the gate to body capacitor for which the oxide layer serves as dielectric, W is the width of the channel, and L is its corresponding length. The aspect ratio of the device (W/L) is related to the conductivity parameter K and has units of $A/V^2$. Vth is the threshold voltage which is the minimum gate voltage required to induce the channel and Vgs is the voltage between the gate and the source of the transistor used in $R_{eq}$.

Since $\mu_n$ is proportional to $1/[T^{1.5-2.0}]$ and Vth is proportional to T, where T is the temperature, when a triode resistor is used $R_{eq}$ increases and $\mu_n$ decreases as the temperature increases. By properly sizing $R_{poly}$ and $(W/L)_2$, the VCO core output amplitude can be adjusted to either be independent of temperature variations or to have a very small variations in response to temperature variations. Since both $R_{poly}$ and $(W/L)_2$ are properly sized to reduce temperature effects on the VCO core output and $R_{poly}$ can vary by ±20% because of random variations, in one embodiment $R_{poly}$ is calibrated by selecting appropriate resistors to give the desired resistance value. In one embodiment, this allows achieving the desired resistance +/−5%.

Transistors 230, 232, and 236 are also included in the YCO core 205 and are used to start up the circuit. Transistor 230 is a PMOS transistor with its source and body coupled to a voltage bus held at voltage YOD and its drain coupled to transistor 232. Transistor 232 is an NMOS transistor with its source and body coupled to ground VSS, its drain coupled to transistor 230, and its gate coupled to the constant gm circuit 210. Transistor 236 is an NMOS transistor with both its source and body coupled to ground VSS, its drain coupled to the constant gm circuit 210, and its gate coupled to both transistor 230 and transistor 232.

Table 1A and Table 1B illustrate a specific embodiment of this invention by specifically identifying transistor properties. Table 1A shows specific values for transistors 230, 232, and 236 located in VCO core 205 whereas Table 1B shows specific values for transistors 132, . . . ,138 located in the constant gm biasing circuit 210. Those skilled in the art will realize that the transistor properties are chosen for specific implementations. For example, if the implementation requires a quick activation of a transistor switch then the transistor may be heavily doped which would result in a high nr value. Similarly, if an implementation prefers a short channel then the L value will be small. Those skilled in the art will further realize that the invention is not limited to these examples and the invention can be implemented using other values.

TABLE 1A

| Transistor | w | l | m | $n_f$ |
|---|---|---|---|---|
| 230 | 16 | 160 | 1 | 1 |
| 232 | 64 | 20 | 2 | 1 |
| 236 | 64 | 20 | 4 | 1 |

TABLE 1B

| Transistor | w | l | m | $n_f$ |
|---|---|---|---|---|
| 132 | 100 | 50 | 150 | 1 |
| 134 | 100 | 50 | 150 | 1 |
| 136 | 128 | 100 | 160 | 1 |
| 138 | 128 | 100 | 40 | 1 |

Figure 3:
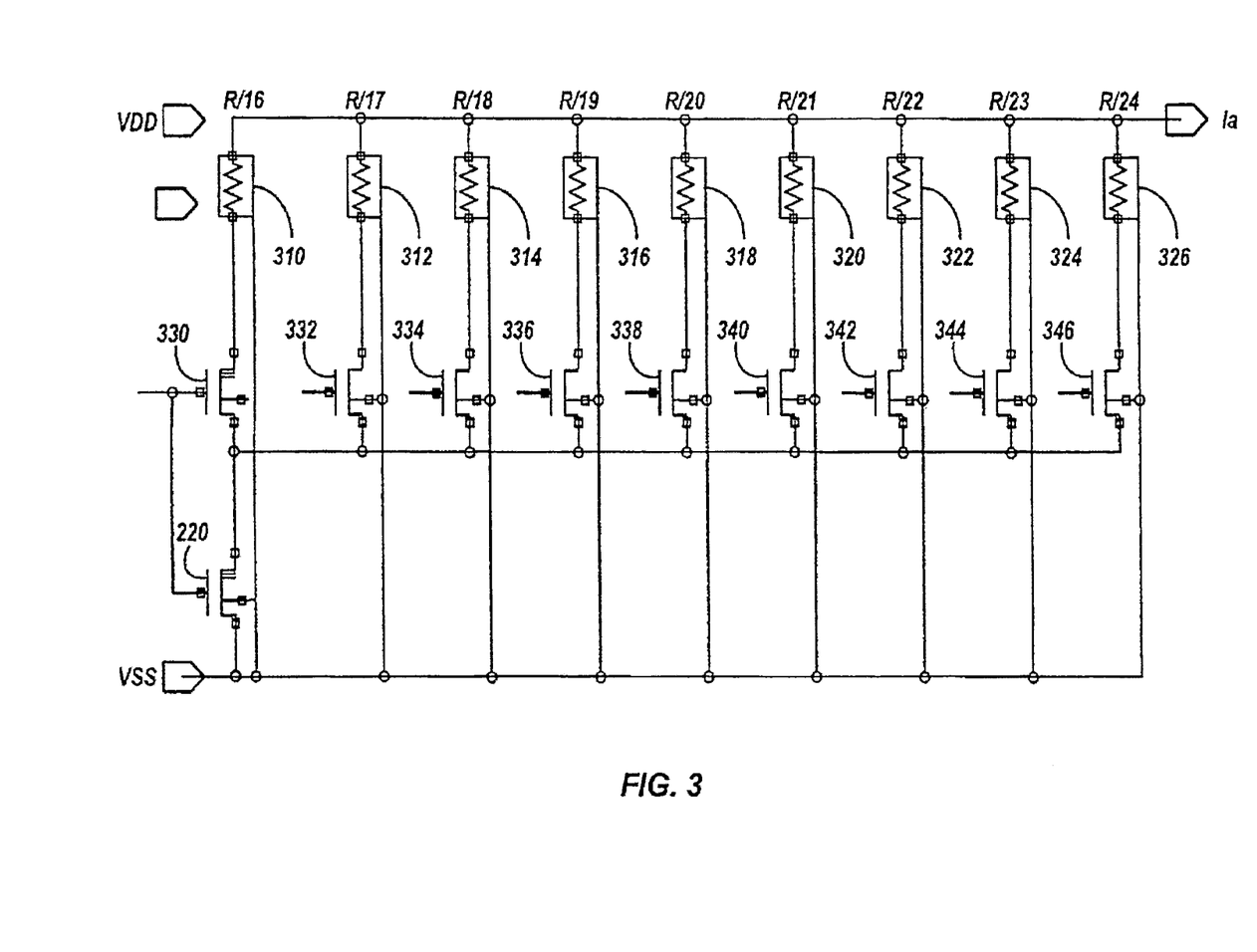
FIG. 3 is a circuit diagram showing the programmable resistor of FIG. 2, in accordance with one embodiment of the invention.

FIG. 3 is a circuit diagram illustrating an embodiment of resistor 240 of FIG. 2 where resistor 240 is programmable. Resistor 240 of FIG. 2 is replaced by resistors 310, . . . , 326 of FIG. 3. Switch 222 of FIG. 2 is transistors 330, . . . ,346 of FIG. 3. The equivalent resistance Req includes the resistance of the triode resistor 220 along with a plurality of polysilicon resistors 310, . . . , 326 and a plurality of switches 330, . . . , 346, in accordance with one embodiment of the invention. The Req circuit of FIG. 3 includes multiple resistors 310, . . . ,326 and multiple transistors 330, . . . ,346 arranged so that one resistor is in series with one transistor forming a combination, which is labeled as R/N (where N=16, . . . , 24) and the combinations R/N are arranged in parallel. FIG. 3 also shows the triode resistor 220 which has a gate coupled to the triode bias voltage generated by the self biasing circuit described in further detail with reference to FIG. 4 below. Additionally, the gate of triode resistor 220 and the gate of switching resistor 330 are coupled together, and are coupled to the self biasing circuit of FIG. 4. In one embodiment, the circuit of FIG. 3 can be made programmable by setting resistor 310 to always be connected and adding one or more of resistors 312-326 in parallel, as needed.

In one embodiment each of the multiple resistors 310, . . . ,326 is a polysilicon resistor and each of the multiple transistors 330, . . . ,346 is an NMOS transistor that is directly coupled to ground VSS. Additionally, triode resistor 220, which is shown as an NMOS transistor, is directly coupled to ground VSS. In this embodiment the gate of triode resistor 220 is coupled to the gate of transistor 330 and both are coupled to a power supply bus which is maintained at a voltage of VDD. Transistors 330, . . . ,346 all have their respective sources coupled to the drain of transistor 220 to allow them to be added in parallel. Additionally, transistors 330, . . . ,346 all have their drains coupled to polysilicon resistors 310, . . . ,326, respectively. Since transistors 332, . . . ,346 have independent voltages going to each gate, these transistors can be individually controlled. In one embodiment the on/off voltages applied to the gates of transistors 332, . . . ,346 can be selected to produce a preferred output. Req is thus programmable because it can be adjusted to produce a certain output. For example, a voltage can be applied to only the first transistor 332 and to none of the other transistors. In another example, voltages can be applied to the first four transistors 332, . . . ,338, but to none of the other transistors. Transistors 332, . . . ,346 act as switches which engages resistors 312, . . . ,326.

In another embodiment multiple resistors 310, . . . ,326 each can have a resistance of approximately 1.83 K-ohms and resistor 310 has m=16 whereas resistors 312, . . . ,326 have m=1. Additionally, the properties of the transistors in this example are given according to Table 2 below. Those skilled in the art will realize that the transistor properties are chosen for specific implementations such adjustments of dopant concentration nr to either increase or decrease the switching time of specific transistors. Those skilled in the art will further realize that the invention is not limited to these examples and the invention can be implemented using other values.

The Req circuit can also be used to adjust for random lot-to-lot variations in resistor values. This adjustment can be done by selectively activating transistors 330, . . . ,346 to respectively engage polysilicon resistors 310, . . . ,326. In this embodiment transistors 330, . . . ,346 act as switches which can be individually opened or closed to activate any sequence of resistors 310, . . . ,326 to achieve a specific resistance and therefore to adjust for random lot-to-lot variations in resistor values.

TABLE 2

| Transistor | w | l | m | $n_f$ |
|---|---|---|---|---|
| 220 | 128 | 32 | 3 | 36 |
| 330 | 128 | 3 | 16 | 4 |
| 332 | 128 | 3 | 1 | 4 |
| 334 | 128 | 3 | 1 | 4 |
| 336 | 128 | 3 | 1 | 4 |
| 338 | 128 | 3 | 1 | 4 |
| 340 | 128 | 3 | 1 | 4 |
| 342 | 128 | 3 | 1 | 4 |
| 344 | 128 | 3 | 1 | 4 |
| 346 | 128 | 3 | 1 | 4 |

Figure 4:
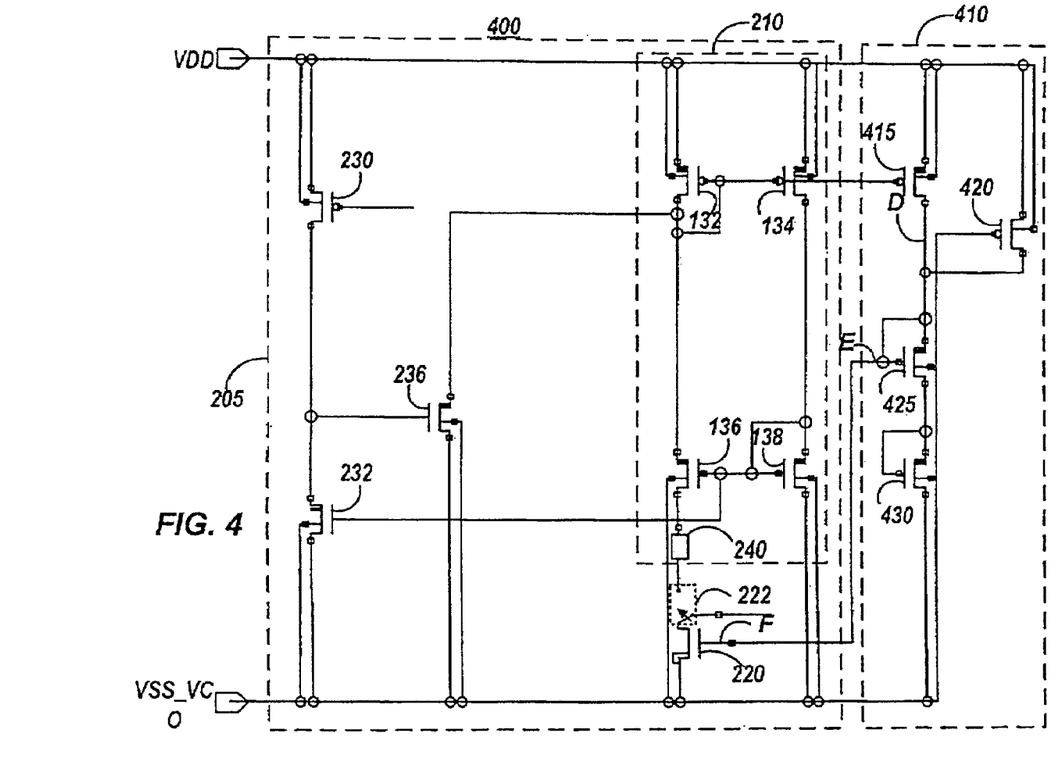
FIG. 4 is a circuit diagram illustrating a constant gm biasing circuit including a triode resistor and a self biasing circuit, in accordance with one embodiment of the invention.

FIG. 4 is a circuit diagram illustrating a constant gm circuit 210 in a VCO core 205 including a triode resistor 220 and a self biasing circuit 410. Triode resistor 220 is used to cancel the temperature effects on the VCO as described above. The triode resistor 220 tracks the swing in the VCO caused by temperature changes. Self biasing circuit 410 is used to provide a stable voltage to the constant gm biasing circuit by generating a voltage output at a location in circuit 410, labeled as point D in FIG. 4, that has filtered out noise in the power supply voltage VDD. Therefore, in one embodiment the triode resistor 220 compensates for the swing of the VCO caused by temperature increases while the self biasing circuit 410 provides a stable voltage so that triode resistor 220 can be appropriately adjusted to track the swing. In a preferred embodiment the combination of the triode resistor 220, the constant gm circuit 210 and the self biasing circuit 410 is used.

Self biasing circuit 410 further includes a first transistor 415, a second transistor 420, a third transistor 425, and a fourth transistor 430. In one embodiment first transistor 415 has a very high resistance and is used to regulate the voltage once the circuit has started up and there is current flowing from the constant gm circuit 210 to the gate of first transistor 415. Second transistor 420 is used during the start up of the self biasing circuit 410 to provide some current because during the start up there is no current flowing to the gate of first transistor 415. Third transistor 425 and fourth transistor 430 act as diodes which provide a two-diode drop. Self biasing circuit 410 outputs a voltage at point E that is stable and independent of any power supply voltage irregularities. The output voltage at point F is then input into the triode resistor 220 so that the triode resistor 220 is exposed to a stable input voltage. The current from constant gm circuit 210 is mirrored by the first transistor 415 so that it can be used to generate a stable voltage at point F. This feedback loop is used to keep the voltage output at point F stable and independent of noise in the power supply resulting from poor power supply rejection.

In one embodiment the VDD of the self biasing circuit 410 is 1.5 volts and the triode resistor 220 is a low voltage device optimized to operate at approximately 1.2 volts. In this embodiment the first transistor 415 and the second transistor 420 reduce the input voltage from approximately 1.5 volts to approximately 1.2 volts at point D. In an alternative embodiment a regulator can be used to reduce the voltage. By using a transistor 415 with high effective resistance, the voltage at point D does not vary much with noise, giving a stable biasing voltage for triode resistor 220.

In one embodiment, the first transistor 415 is an PMOS transistor with its source and body coupled to the voltage bus bar VDD, its gate coupled to the gates of transistors 132 and 134 in the constant gm circuit 210 and its drain coupled to the third transistor 425. In this embodiment, the second transistor 420 is also a PMOS transistor with its source and body both coupled to the voltage bus bar VDD, its gate coupled to ground VSS and its drain coupled to the third transistor 425. The third transistor 425 is an NMOS transistor with its source coupled to the fourth transistor 430, its body coupled to ground VSS, its gate coupled to both the triode resistor 220 and to its drain by a bypass loop, and its drain coupled to both the first transistor 415 and second transistor 420. The fourth transistor 430 is an NMOS transistor with its source and body coupled to ground VSS, its gate coupled to its drain through a bypass loop, and its drain coupled to the third transistor 425.

In another embodiment of the self biasing circuit used in the biasing circuit of FIG. 4, the properties of the transistors are identified according to the values in Table 3 below. In this embodiment the properties and values of the other transistors and resistors illustrated in FIG. 4 are provided in Tables 1A, 1B and 2, above. Those skilled in the art will realize that the transistor properties are chosen for specific implementations such as adjusting the dopant concentration nr to either increase or decrease the switching time of specific transistors. Those skilled in the art will further realize that the invention is not limited to these examples and the invention can be implemented using other values.

TABLE 3

| Transistor | w | l | m | $n_f$ |
|---|---|---|---|---|
| 415 | 100 | 50 | 12 | 1 |
| 420 | 100 | 200 | 1 | 1 |
| 425 | 128 | 100 | 10 | 1 |
| 430 | 128 | 100 | 10 | 1 |

Figure 5:
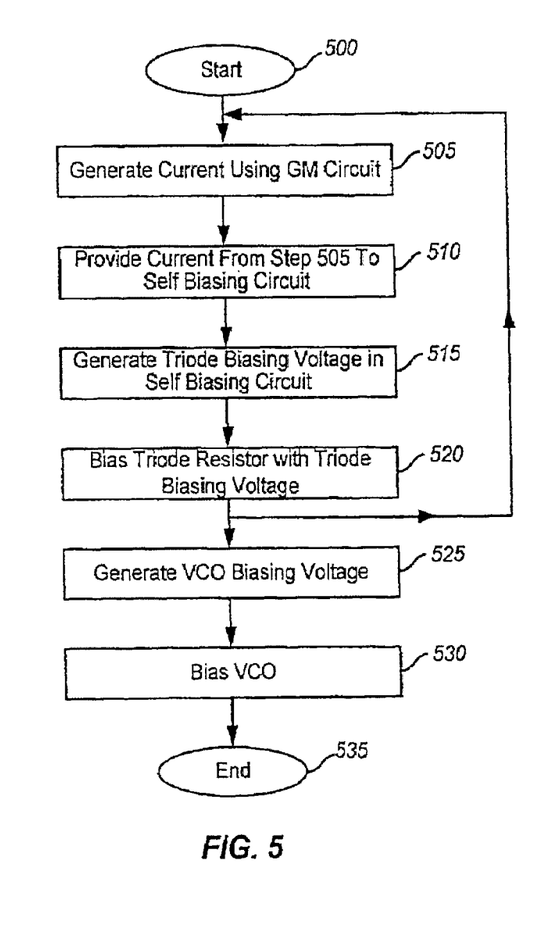
FIG. 5 is a flowchart showing the steps used to bias a VCO so that that the biasing is not affected by variations in temperature, in accordance with one embodiment of the present invention.

FIG. 5 is a flowchart showing the steps used to start up the biasing of a voltage controlled oscillator (VCO) so that the biasing is not significantly affected by variations in temperature and can be performed under low power consumption requirements as well as low noise requirements. Circuit 400 is one embodiment of a circuit that uses the steps in this flowchart to bias the voltage controlled oscillator. In step 500 the process initialization takes place so that the circuit is running in steady state mode. During the initialization process, transistor 420 is used to provide an initial current (kick start) to the triode resistor 220 and the constant gm circuit 210 which is fed back into the self biasing circuit 410 through the current mirroring. Next in step 505 the constant gm circuit 210 generates a current sufficient enough to operate the self biasing circuit 410 in steady state mode rather then in ramp up mode. This current is generated using a biased triode resistor, as described below with reference to step 520. This current is then provided to the self biasing circuit 410 in step 510. Next in step 515, the self biasing circuit 410 generates a triode biasing voltage that is used to bias the triode resistor 220 in step 520. The biased triode resistor 220 is then used again to adjust the current generated by constant gm circuit 210 in step 505 until a stable VCO biasing voltage is obtained. In step 525, the VCO bias voltage is generated using the circuit which includes the constant gm circuit 210, the self biasing circuit 410 and the biased triode resistor 220. The VCO bias voltage is generated using the current from equation (2) above and the impedance of the circuit 400. Next in step 530 the VCO is biased. Finally, the process ends in step 535.

Figure 6A:
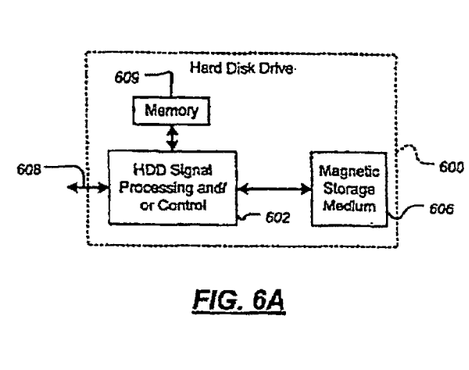
FIGS. 6A-6H illustrate various exemplary systems in which embodiments of the present invention are implemented.

FIGS. 6A-6G show various exemplary systems in which the present invention is incorporated. FIG. 6A is an illustration showing the present invention embodied in a hard disk drive 600. The present invention may be implemented in either or both signal processing and/or control circuits, which are generally identified in FIG. 6A at 602. In some implementations, signal processing and/or control circuit 602 and/or other circuits (not shown) in HDD 600 may process data, perform coding and/or encryption, perform calculations, and/or format data that is output to and/or received from a magnetic storage medium 606.

HDD 600 may communicate with a host device (not shown) such as a computer, mobile computing devices such as personal digital assistants, cellular phones, media or MP3 players and the like, and/or other devices via one or more wired or wireless communication links 608. HDD 600 may be connected to memory 609, such as random access memory (RAM), a low latency nonvolatile memory such as flash memory, read only memory (ROM) and/or other suitable electronic data storage.

Figure 6B:
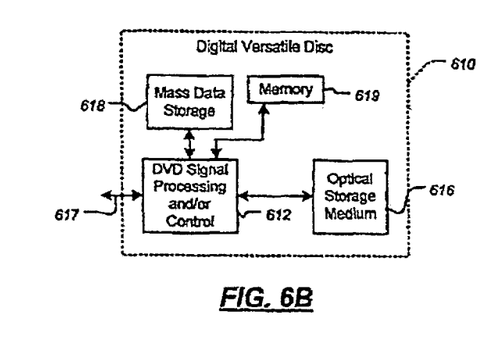

FIG. 6B is an illustration showing the present invention embodied in a digital versatile disc (DVD) drive 610. The present invention may be implemented in either or both signal processing and/or control circuits, which are generally identified in FIG. 6B at 612, and/or mass data storage 618 of DVD drive 610. Signal processing and/or control circuit 612 and/or other circuits (not shown) in DVD 610 may process data, perform coding and/or encryption, perform calculations, and/or format data that is read from and/or data written to an optical storage medium 616. In some implementations, signal processing and/or control circuit 612 and/or other circuits (not shown) in DVD 610 can also perform other functions such as encoding and/or decoding and/or any other signal processing functions associated with a DVD drive.

DVD drive 610 may communicate with an output device (not shown) such as a computer, television or other device via one or more wired or wireless communication links 617. DVD 610 may communicate with mass data storage 618 that stores data in a nonvolatile manner. Mass data storage 618 may include a hard disk drive (HDD) such as that shown in FIG. 6A. The HDD may be a mini HDD that includes one or more platters having a diameter that is smaller than approximately 1.8". DVD 610 may be connected to memory 619, such as RAM, ROM, low latency nonvolatile memory such as flash memory, and/or other suitable electronic data storage.

Figure 6C:
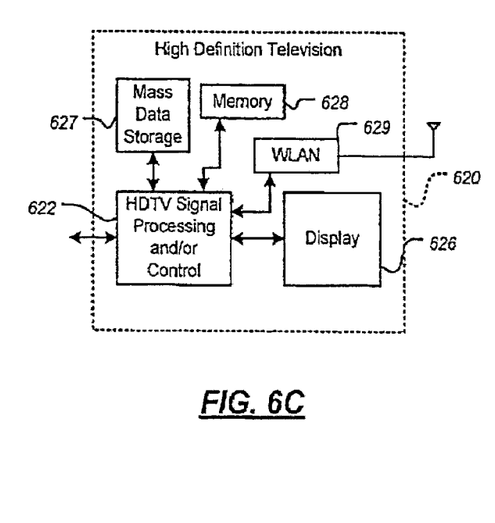

FIG. 6C is an illustration showing the present invention embodied in a high definition television (HDTV) 620. The present invention may be implemented in either or both signal processing and/or control circuits, which are generally identified in FIG. 6C at 622, a WLAN interface and/or mass data storage of the HDTV 620. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629.

Figure 6D:
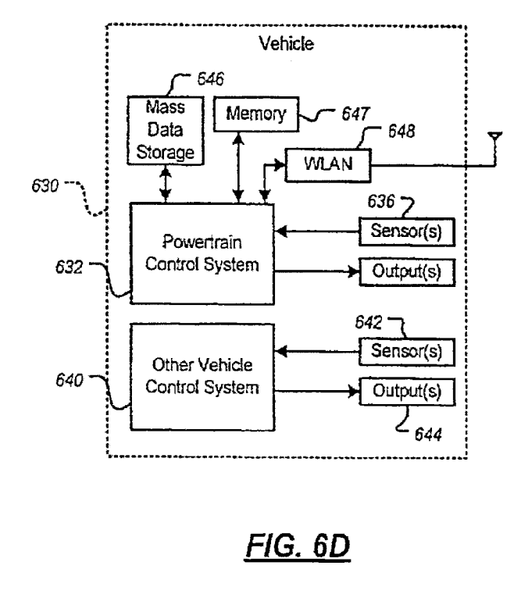

FIG. 6D is an illustration showing the present invention implemented in a control system of a vehicle 630, a WLAN interface and/or mass data storage of the vehicle controlled system. A power train control system 632 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 640 of vehicle 630. Control system 640 may likewise receive signals from input sensors 642 and/or output control signals to one or more output devices 644. In some implementations, control system 640 may be part of an anti-lock braking system (ABS), a navigation system, a telemetric system, a vehicle telemetric system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The control system 640 may also include mass data storage, memory and/or a WLAN interface (all not shown).

Figure 6E:
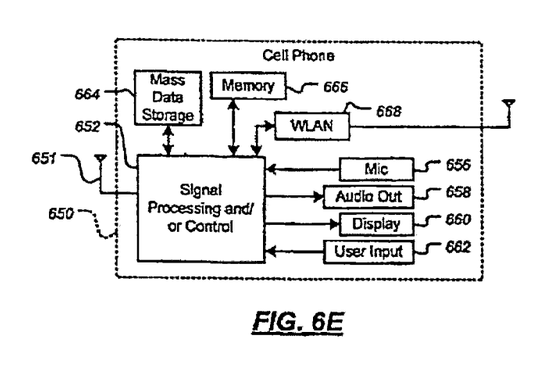

FIG. 6E is an illustration showing the present invention embodied in a cellular phone 650 that may include a cellular antenna 651. The present invention may be implemented in either or both signal processing and/or control circuits, which are generally identified in FIG. 6E at 652, a WLAN interface and/or mass data storage of the cellular phone 650. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage. Cellular phone 650 also may support connections with a WLAN via a WLAN network interface 668.

Figure 6F:
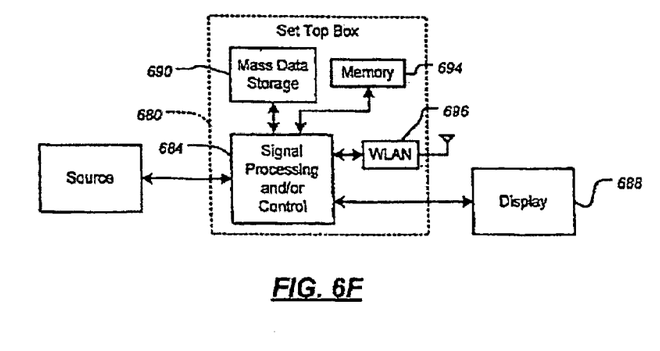

FIG. 6F is an illustration showing the present invention embodied in a set top box 680. The present invention may be implemented in either or both signal processing and/or control circuits, which are generally identified in FIG. 6F at 684, a WLAN interface and/or mass data storage of the set top box 680. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Set top box 680 may be connected to memory 0694 such as RAM, ROM, low latency nonvolatile memory such as flash memory and/or other suitable electronic data storage. Set top box 680 also may support connections with a WLAN via a WLAN network interface 696.

Figure 6G:
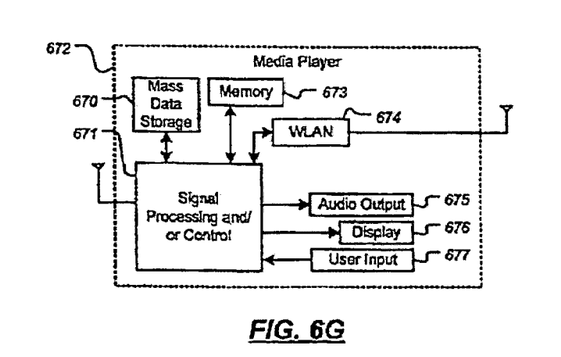

FIG. 6G is an illustration showing the present invention embodied in a media player 672. The present invention may be implemented in either or both signal processing and/or control circuits, which are generally identified in FIG. 6G at 671, a WLAN interface and/or mass data storage of the media player 672. In some implementations, media player 672 includes a display 676 and/or a user input 677 such as a keypad, touchpad and the like. In some implementations, media player 672 may employ a graphical user interface (GUI) that typically employs menus, drop down menus, icons and/or a point-and-click interface via display 676 and/or user input 677. Media player 672 further includes an audio output 675 such as a speaker and/or audio output jack. Signal processing and/or control circuits 671 and/or other circuits (not shown) of media player 672 may process data, perform coding and/or encryption, perform calculations; format data and/or perform any other media player function.

Media player 672 may communicate with mass data storage 670 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Media player 672 may be connected to memory 673 such as RAM, ROM, low latency nonvolatile memory such as flash memory and/or other suitable electronic data storage. Media player 672 also may support connections with a WLAN via a WLAN network interface 674.

Figure 6H:
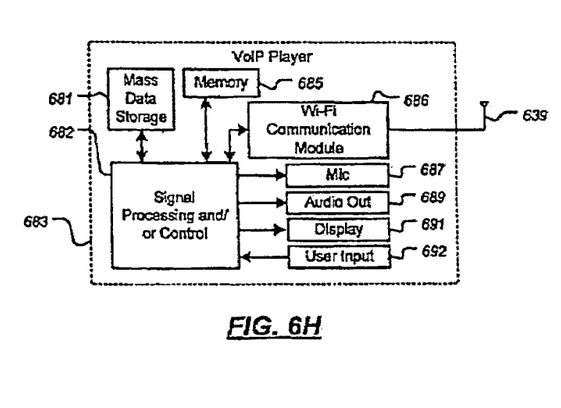

FIG. 6H is an illustration showing the present invention embodied in a Voice over Internet Protocol (VoIP) phone 683 that may include an antenna 639. The present invention may be implemented in either or both signal processing and/or control circuits, which are generally identified in FIG. 6H at 682, a wireless interface and/or mass data storage of the VoIP phone 683. In some implementations, VoIP phone 683 includes, in part, a microphone 687, an audio output 689 such as a speaker and/or audio output jack, a display monitor 691, an input device 692 such as a keypad, pointing device, voice actuation and/or other input devices, and a Wireless Fidelity (Wi-Fi) communication module 686. Signal processing and/or control circuits 682 and/or other circuits (not shown) in VoIP phone 683 may process data, perform coding and/or encryption, perform calculations, format data and/or perform other VoIP phone functions.

VoIP phone 683 may communicate with mass data storage 681 that stores data in a nonvolatile manner such as optical and/or magnetic storage devices, for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". VoIP phone 683 may be connected to memory 685, which may be a RAM, ROM, low latency nonvolatile memory such as flash memory and/or other suitable electronic data storage. VoIP phone 683 is configured to establish communications link with a VoIP network (not shown) via Wi-Fi communication module 686. Still other implementations in addition to those described above are contemplated.

The above description of exemplary embodiments of the invention has been presented for purposes of illustration and description. It is not intended to be exhaustive or to limit the invention to the precise form described, and many modifications and variations are possible in light of the teaching above. Thus, the embodiments were chosen and described in order to best explain the principles of the invention and its practical applications to thereby enable others skilled in the art to best utilize the invention in various embodiments and with various modifications as are suited to the particular use contemplated.

What is claimed is:

1. A biasing circuit comprising:
   a triode resistor coupled to a constant transconductance (gm) circuit; and
   a self biasing circuit configured to generate a voltage to drive the triode resistor, the voltage being based on a current generated by the constant transconductance circuit,
   wherein the self biasing circuit comprises a first switch and a second switch,
   wherein, during a start-up mode of operation, the first switch is configured to provide an initial current to the triode resistor, and
   wherein, during a steady-state mode of operation, the second switch is configured to regulate the voltage driving the triode resistor.

2. The biasing circuit of claim 1, wherein the triode resistor is configured to adjust the current generated by the constant transconductance circuit.

3. The biasing circuit of claim 1, wherein the voltage comprises a triode biasing voltage that biases the triode resistor.

4. The biasing circuit of claim 1, wherein the triode resistor comprises a transistor configured to operate in a triode region.

5. The biasing circuit of claim 1, wherein the second switch is configured to mirror the current of the constant transconductance circuit.

6. The biasing circuit of claim 1, wherein the second switch comprises a high impedance transistor coupled to a node, the high impedance transistor used to drive the triode resistor.

7. The biasing circuit of claim 6, wherein the node is coupled to at least two series connected diode elements.

8. The biasing circuit of claim 1, wherein the biasing circuit comprises a constant transconductance biasing core for a voltage controlled oscillator.

9. The biasing circuit of claim 1, further comprising a power supply bus configured to receive a power supply voltage from a power supply, wherein the voltage driving the triode resistor is independent of noise in the power supply.

10. The biasing circuit of claim 1, further comprising a plurality of polysilicon resistors arranged in parallel and coupled to the triode resistor through a plurality of switches, wherein an equivalent resistance determined by the triode resistor and one or more of the plurality of switches is configured to be adjusted through control of the plurality of switches.

11. A method of generating a bias voltage, the method comprising:
    during a start-up mode of operation of a self biasing circuit, providing, with a first switch of the self biasing circuit, an initial current to a triode resistor and a constant transconductance circuit; and
    during a steady-state mode of operation of the self biasing circuit:
      driving the triode resistor with a voltage generated by the self biasing circuit, the voltage generated based on a current generated by the constant transconductance circuit; and
      regulating the voltage with a second switch of the self biasing circuit.

12. The method of claim 11, further comprising:
    adjusting, with the triode resistor, the current generated by the constant transconductance circuit.

13. The method of claim 11, wherein the voltage comprises a triode biasing voltage that biases the triode resistor.

14. The method of claim 11, wherein driving the triode resistor comprises driving the triode resistor to operate in a triode region.

15. The method of claim 11, further comprising:
    mirroring, with the second switch, the current generated by the constant transconductance circuit.

16. The method of claim 11, wherein the second switch comprises a high impedance transistor coupled to a node, and wherein driving the triode resistor comprises driving the triode resistor the high impedance transistor.

17. The method of claim 16, wherein the node is coupled to at least two series connected diode elements.

18. The method of claim 11, further comprising:
    supplying a power supply voltage generated from a power supply to power supply bus, wherein driving the triode resistor comprises driving the triode resistor with a voltage independent of noise in the power supply.

19. The method of claim 11, wherein a plurality of polysilicon resistors arranged in parallel is electrically coupled to the triode resistor through a plurality of switches, the method further comprising:
controlling the plurality of switches to adjust an equivalent resistance determined by the triode resistor and one or more of the plurality of polysilicon resistors.

* * * * *